(12) United States Patent
Benisty et al.

(10) Patent No.: US 12,184,307 B2
(45) Date of Patent: Dec. 31, 2024

(54) MITIGATING DBI BIT FLIP INDUCED ERRORS

(71) Applicant: Western Digital Technologies, Inc., San Jose, CA (US)

(72) Inventors: Shay Benisty, Beer Sheva (IL); Judah Gamliel Hahn, Ofra (IL); Ariel Navon, Revava (IL)

(73) Assignee: Sandisk Technologies, Inc., Milpitas, CA (US)

( * ) Notice: Subject to any disclaimer, the term of this patent is extended or adjusted under 35 U.S.C. 154(b) by 289 days.

(21) Appl. No.: 17/646,378

(22) Filed: Dec. 29, 2021

(65) Prior Publication Data
US 2023/0208446 A1   Jun. 29, 2023

(51) Int. Cl.
*H03M 13/45* (2006.01)
(52) U.S. Cl.
CPC ................................. *H03M 13/45* (2013.01)
(58) Field of Classification Search
CPC .. G06F 11/1048; G06F 11/1068; H03M 13/45
See application file for complete search history.

(56) References Cited

U.S. PATENT DOCUMENTS

| 9,703,625 B1 | 7/2017 | Greenberg et al. | |
|---|---|---|---|
| 10,621,116 B2 | 4/2020 | Brief | |
| 2006/0261929 A1* | 11/2006 | Hein | G11C 7/109 340/146.2 |
| 2010/0005281 A1* | 1/2010 | Buchmann | G06F 13/4243 713/2 |
| 2011/0083060 A1* | 4/2011 | Sakurada | G11C 11/5642 714/763 |
| 2013/0061102 A1* | 3/2013 | Sohn | G11C 7/1063 714/718 |
| 2014/0032801 A1* | 1/2014 | Nixon | G06F 11/364 710/107 |

(Continued)

FOREIGN PATENT DOCUMENTS

WO    2018080360 A1    5/2018

OTHER PUBLICATIONS

Skerlj et al. "Error Protected Data Bus Inversion Using Standard DRAM Components," 9th International Symposium on Quality Electronic Design (isqed 2008), 2008, pp. 35-42, doi: 10.1109/ISQED.2008.4479694.

*Primary Examiner* — Jigar P Patel
(74) *Attorney, Agent, or Firm* — PATTERSON + SHERIDAN, LLP

(57) ABSTRACT

The present disclosure generally relates to improving data transfer in a data storage device. In double data rate (DDR) systems that include a data bus inversion (DBI) functionality, bit flip events can be more prevalent. To mitigate the effect of enhanced erroneous bit flip rate related to DBI bit flip events, the DBI bit can stay static for a predetermined number of consecutive clock cycles, the error correction module can be informed of reduced reliability due to active DBI bit events, the DBI bit can be set to 0, or combinations thereof. Setting the DBI bit to 0 effectively cancels DBI functionality. Informing the error correction module permits a more robust error correction to occur. Forcing the DBI bit to remain static reduces the probability of an unrecognized bit flip event of a full byte. In so doing, data transfer reliability is improved when using DBI functionality.

15 Claims, 8 Drawing Sheets

(56) References Cited

U.S. PATENT DOCUMENTS

| | | | |
|---|---|---|---|
| 2019/0305765 A1* | 10/2019 | Lee | G06F 13/4282 |
| 2020/0104209 A1* | 4/2020 | El Gamal | G11C 29/52 |
| 2020/0251159 A1* | 8/2020 | Lanka | G11C 5/06 |
| 2020/0409786 A1 | 12/2020 | Riho et al. | |

* cited by examiner

MITIGATING DBI BIT FLIP INDUCED ERRORS

BACKGROUND OF THE DISCLOSURE

Field of the Disclosure

Embodiments of the present disclosure generally relate to improving data transfer in a data storage device.

Description of the Related Art

Double data rate (DDR) systems may include a data bus inversion (DBI) functionality, which is targeted to save power and improve performance while working in toggle mode. The main idea of the DBI functionality is that in some cases, instead of toggling a whole byte of channel lines, a controller with DBI enabled capability will turn on the DBI bit, indicating whether the data (i.e., X) on the channel line should be treated as X or NOT(X). By that, toggling of the channel lines is minimized. In that manner, the DBI bit can be treated as a revert bit.

For example, if a single data channel, which is a byte that contains eight bits, all of which are "0", has the DBI bit set to "0", all of the data in the data channel is correct as written. Now for the next channel, if the byte is intended to be all "1", then a simple, power conscious manner to handle the data is to leave the bits in the channel set at "0", but set the DBI bit to "1". The DBI bit of "1" indicates that the entire channel should be flipped. If there were no DBI bit, then the channel would need to have the entire byte flipped to "1". In other words, eight bits would need flipped from "0" to "1", and the flipping consumes a certain amount of power. However, if only the DBI bit is flipped from "0" to "1" and the remaining byte is not flipped, then less power is consumed.

In high toggle modes, there might be signal integrity issues that lead to bit errors while transferring data on the interface. Additionally, while a flipped bit error produces a single bit error, an incorrect DBI signal leads to eight bit errors as the whole channel byte is incorrect. As such, DBI functionality is much more prone to bit flip errors. The bit flip error for DBI functionality is that the DBI bit is incidentally flipped, which means the entire channel is incorrect. Channel data byte flips potentially cause a problem of "hard errors" which refers to flipped bits that are coupled to high reliability (e.g., log likelihood ratio (LLR) values). Such kind of "hard errors", specifically when appearing in consecutive bits (i.e., bursts) may burden the decoding procedure versus regular errors, which typically are allocated lower reliability values.

Therefore, there is a need in the art to mitigate the effect of enhanced erroneous bit flip rate related to DBI bit flip events.

SUMMARY OF THE DISCLOSURE

The present disclosure generally relates to improving data transfer in a data storage device. In double data rate (DDR) systems that include a data bus inversion (DBI) functionality, bit flip events can be more prevalent. To mitigate the effect of enhanced erroneous bit flip rate related to DBI bit flip events, the DBI bit can stay static for a predetermined number of consecutive clock cycles, the error correction module can be informed of reduced reliability due to active DBI bit events, the DBI bit can be set to 0, or combinations thereof. Setting the DBI bit to 0 effectively cancels DBI functionality. Informing the error correction module permits a more robust error correction to occur. Forcing the DBI bit to remain static reduces the probability of an unrecognized bit flip event of a full byte. In so doing, data transfer reliability is improved when using DBI functionality.

In one embodiment, a data storage device comprises: a memory device; and a controller coupled to the memory device, wherein the controller is configured to: receive data from a host device; arrange the data into one or more bursts, wherein each burst comprises a plurality of bytes; set a data bus inversion (DBI) bit for each byte, wherein a plurality of consecutive DBI bits within at least one burst of the one or more bursts are identical; and send the one or more bursts and DBI bits to the memory device.

In another embodiment, a data storage device comprises: a memory device; and a controller coupled to the memory device, wherein the controller is configured to: retrieve data from the memory device; send retrieved data to a decoder; search a log likelihood ratio (LLR) table for reliability indication of the retrieved data; send data bus inversion (DBI) bit information to the decoder for the retrieved data; and decode the retrieved data.

In another embodiment, a data storage device comprises: memory means; and a controller coupled to the memory means, wherein the controller is configured to: maintain a data bus inversion (DBI) bit at a constant value for a plurality of consecutive bytes of a data burst; and decode data retrieved from the memory means, wherein a level of decoding is based in part upon the DBI bit.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to improving data transfer in a data storage device. In double data rate (DDR) systems that include a data bus inversion (DBI) functionality, bit flip events can be more prevalent. To mitigate the effect of enhanced erroneous bit flip rate related to DBI bit flip events, the DBI bit can stay static for a predetermined number of consecutive clock cycles, the error correction module can be informed of reduced reliability due to active DBI bit events, the DBI bit can be set to 0, or combinations thereof. Setting the DBI bit to 0 effectively cancels DBI functionality. Informing the error correction module permits a more robust error correction to occur. Forcing the DBI bit to remain static reduces the probability of an unrecognized bit flip event of a full byte. In so doing, data transfer reliability is improved when using DBI functionality.

Figure 1:
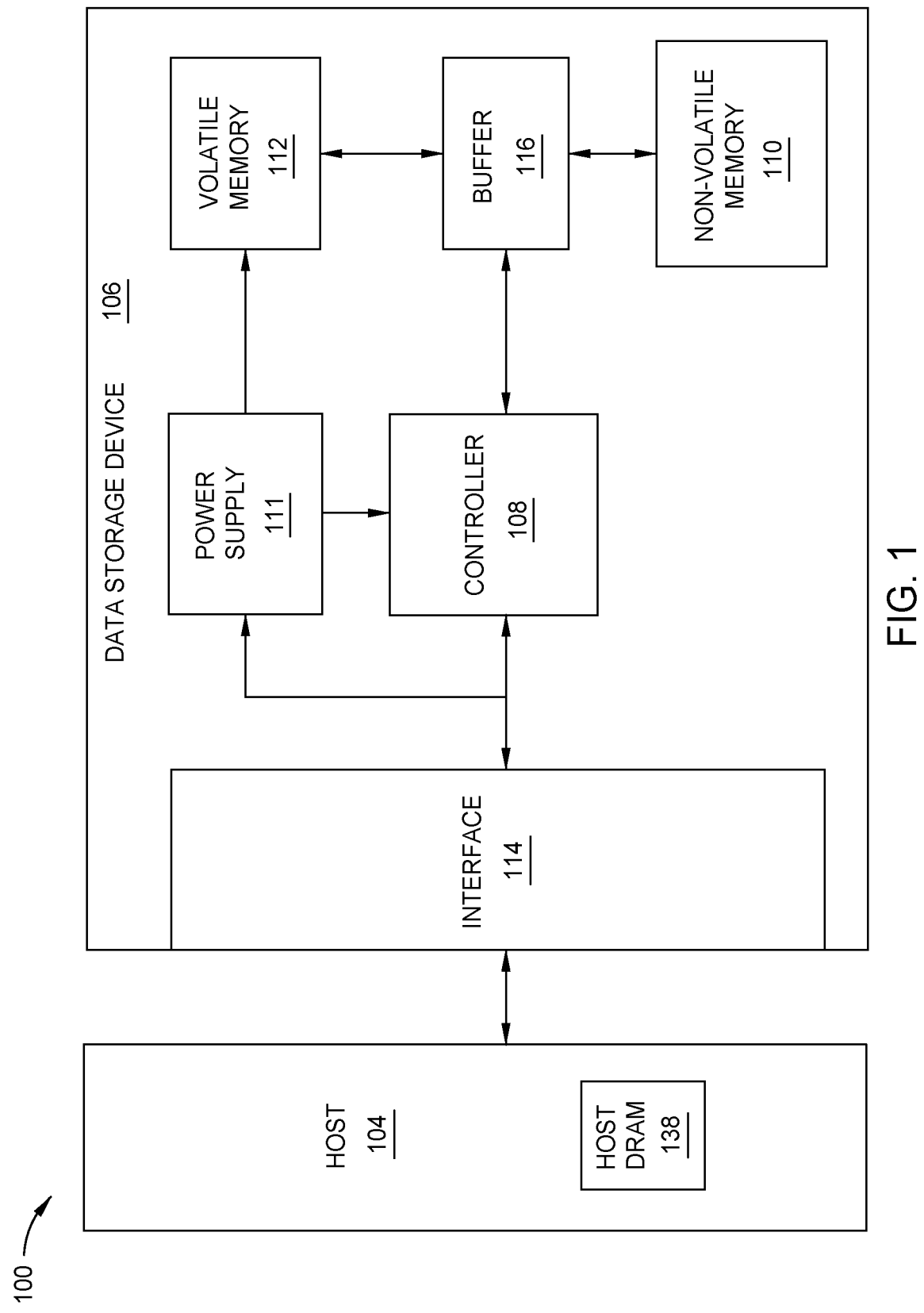
FIG. 1 is a schematic block diagram illustrating a storage system in which a data storage device may function as a storage device for a host device, according to certain embodiments.

FIG. 1 is a schematic block diagram illustrating a storage system 100 in which a host device 104 is in communication with a data storage device 106, according to certain embodiments. For instance, the host device 104 may utilize a non-volatile memory (NVM) 110 included in data storage device 106 to store and retrieve data. The host device 104 comprises a host DRAM 138. In some examples, the storage system 100 may include a plurality of storage devices, such as the data storage device 106, which may operate as a storage array. For instance, the storage system 100 may include a plurality of data storage devices 106 configured as a redundant array of inexpensive/independent disks (RAID) that collectively function as a mass storage device for the host device 104.

The host device 104 may store and/or retrieve data to and/or from one or more storage devices, such as the data storage device 106. As illustrated in FIG. 1, the host device 104 may communicate with the data storage device 106 via an interface 114. The host device 104 may comprise any of a wide range of devices, including computer servers, network-attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, or other devices capable of sending or receiving data from a data storage device.

The data storage device 106 includes a controller 108, NVM 110, a power supply 111, volatile memory 112, the interface 114, and a write buffer 116. In some examples, the data storage device 106 may include additional components not shown in FIG. 1 for the sake of clarity. For example, the data storage device 106 may include a printed circuit board (PCB) to which components of the data storage device 106 are mechanically attached and which includes electrically conductive traces that electrically interconnect components of the data storage device 106 or the like. In some examples, the physical dimensions and connector configurations of the data storage device 106 may conform to one or more standard form factors. Some example standard form factors include, but are not limited to, 3.5" data storage device (e.g., an HDD or SSD), 2.5" data storage device, 1.8" data storage device, peripheral component interconnect (PCI), PCI-extended (PCI-X), PCI Express (PCIe) (e.g., PCIe x1, x4, x8, x16, PCIe Mini Card, MiniPCI, etc.). In some examples, the data storage device 106 may be directly coupled (e.g., directly soldered or plugged into a connector) to a motherboard of the host device 104.

Interface 114 may include one or both of a data bus for exchanging data with the host device 104 and a control bus for exchanging commands with the host device 104. Interface 114 may operate in accordance with any suitable protocol. For example, the interface 114 may operate in accordance with one or more of the following protocols: advanced technology attachment (ATA) (e.g., serial-ATA (SATA) and parallel-ATA (PATA)), Fibre Channel Protocol (FCP), small computer system interface (SCSI), serially attached SCSI (SAS), PCI, and PCIe, non-volatile memory express (NVMe), OpenCAPI, GenZ, Cache Coherent Interface Accelerator (CCIX), Open Channel SSD (OCSSD), or the like. Interface 114 (e.g., the data bus, the control bus, or both) is electrically connected to the controller 108, providing an electrical connection between the host device 104 and the controller 108, allowing data to be exchanged between the host device 104 and the controller 108. In some examples, the electrical connection of interface 114 may also permit the data storage device 106 to receive power from the host device 104. For example, as illustrated in FIG. 1, the power supply 111 may receive power from the host device 104 via interface 114.

The NVM 110 may include a plurality of memory devices or memory units. NVM 110 may be configured to store and/or retrieve data. For instance, a memory unit of NVM 110 may receive data and a message from controller 108 that instructs the memory unit to store the data. Similarly, the memory unit may receive a message from controller 108 that instructs the memory unit to retrieve data. In some examples, each of the memory units may be referred to as a die. In some examples, the NVM 110 may include a plurality of dies (i.e., a plurality of memory units). In some examples, each memory unit may be configured to store relatively large amounts of data (e.g., 128 MB, 256 MB, 512 MB, 1 GB, 2 GB, 4 GB, 8 GB, 16 GB, 32 GB, 64 GB, 128 GB, 256 GB, 512 GB, 1 TB, etc.).

In some examples, each memory unit may include any type of non-volatile memory devices, such as flash memory devices, phase-change memory (PCM) devices, resistive random-access memory (ReRAM) devices, magneto-resistive random-access memory (MRAM) devices, ferroelectric random-access memory (F-RAM), holographic memory devices, and any other type of non-volatile memory devices.

The NVM 110 may comprise a plurality of flash memory devices or memory units. NVM Flash memory devices may include NAND or NOR-based flash memory devices and may store data based on a charge contained in a floating gate of a transistor for each flash memory cell. In NVM flash memory devices, the flash memory device may be divided into a plurality of dies, where each die of the plurality of dies includes a plurality of physical or logical blocks, which may be further divided into a plurality of pages. Each block of the plurality of blocks within a particular memory device may include a plurality of NVM cells. Rows of NVM cells may be electrically connected using a word line to define a page of a plurality of pages. Respective cells in each of the plurality of pages may be electrically connected to respective bit lines. Furthermore, NVM flash memory devices may be 2D or 3D devices and may be single level cell (SLC), multi-level cell (MLC), triple level cell (TLC), or quad level cell (QLC). The controller 108 may write data to and read data from NVM flash memory devices at the page level and erase data from NVM flash memory devices at the block level.

The power supply 111 may provide power to one or more components of the data storage device 106. When operating in a standard mode, the power supply 111 may provide power to one or more components using power provided by an external device, such as the host device 104. For instance, the power supply 111 may provide power to the one or more components using power received from the host device 104 via interface 114. In some examples, the power supply 111 may include one or more power storage components configured to provide power to the one or more components when operating in a shutdown mode, such as where power ceases to be received from the external device. In this way, the power supply 111 may function as an onboard backup power source. Some examples of the one or more power storage components include, but are not limited to, capacitors, super-capacitors, batteries, and the like. In some examples, the amount of power that may be stored by the one or more power storage components may be a function of the cost and/or the size (e.g., area/volume) of the one or more power storage components. In other words, as the amount of power stored by the one or more power storage components increases, the cost and/or the size of the one or more power storage components also increases.

The volatile memory 112 may be used by controller 108 to store information. Volatile memory 112 may include one or more volatile memory devices. In some examples, controller 108 may use volatile memory 112 as a cache. For instance, controller 108 may store cached information in volatile memory 112 until the cached information is written to the NVM 110. As illustrated in FIG. 1, volatile memory 112 may consume power received from the power supply 111. Examples of volatile memory 112 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)).

Controller 108 may manage one or more operations of the data storage device 106. For instance, controller 108 may manage the reading of data from and/or the writing of data to the NVM 110. In some embodiments, when the data storage device 106 receives a write command from the host device 104, the controller 108 may initiate a data storage command to store data to the NVM 110 and monitor the progress of the data storage command. Controller 108 may determine at least one operational characteristic of the storage system 100 and store at least one operational characteristic in the NVM 110. In some embodiments, when the data storage device 106 receives a write command from the host device 104, the controller 108 temporarily stores the data associated with the write command in the internal memory or write buffer 116 before sending the data to the NVM 110.

Figure 2A:
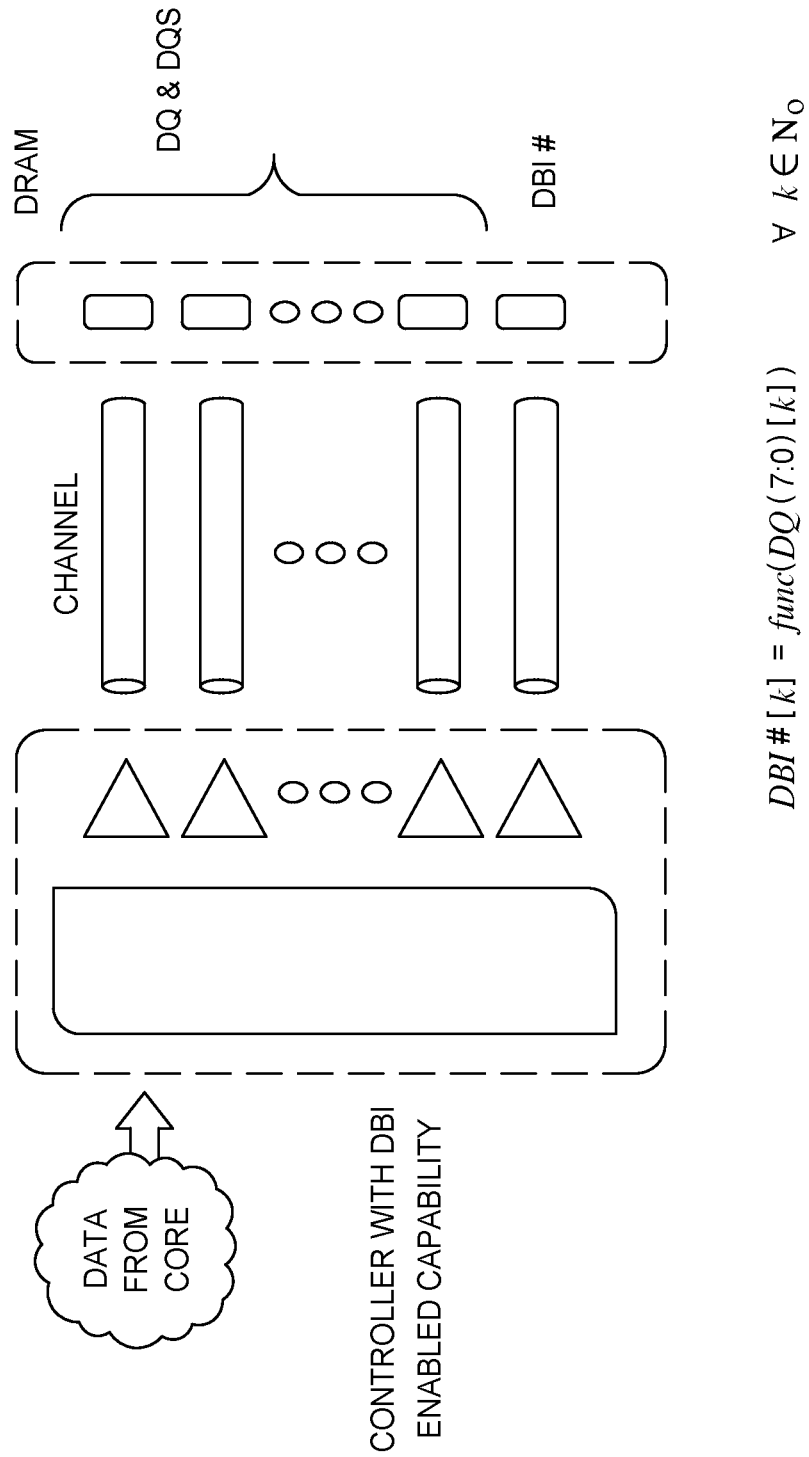
FIG. 2A is a schematic illustration of a DBI configuration from a functional view.

FIG. 2A is a schematic illustration of a DBI configuration from a functional view. In a broad sense, data to be written to a storage device is initially received from a core, or host device. The controller of the data storage device is enabled with DBI functionalities or capabilities. The data is sent to the memory device, exemplified to be DRAM in FIG. 2A, via channels. In an embodiment where data would be sent to the memory device from the controller as a byte, the eight bits of the byte would be spread across eight different channels. In such a way, each bit of a byte would be transmitted through a different channel simultaneously. The data would be transmitted as a DQ signal based upon the timing of a clock signal (i.e., DQS). As the controller is enabled with DBI functionality, the DBI bit or pin would be sent simultaneously with the eight bits of the byte to the memory device. The DBI bit would be sent in a distinct channel from the eight bits of the byte. The DBI bit would be transmitted in timing coordinated with the clock signal. The DBI bit would be transmitted simultaneously with the eight bits. Thus, in the embodiment shown in FIG. 2A, there would be nine channels between the controller and the memory device, one channel dedicated to the DBI bit and eight channels dedicated to the eight bits of the single byte.

Figure 2B:
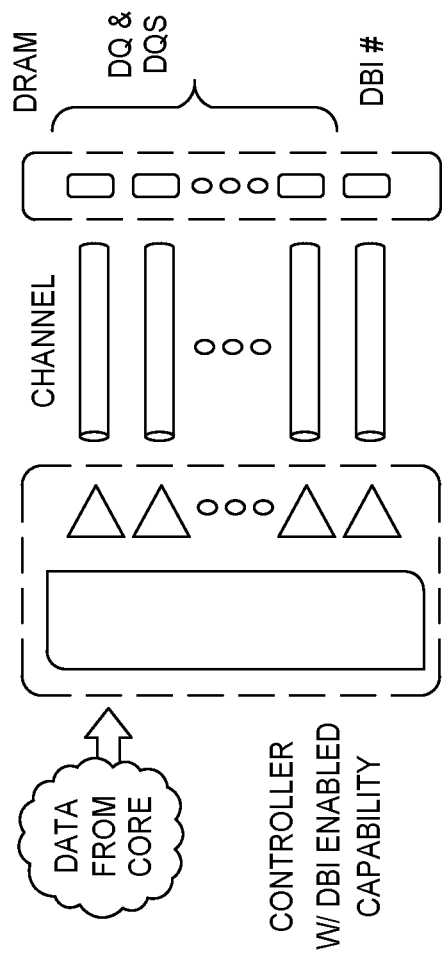
FIG. 2B is a schematic illustration of a DBI configuration from a burst length view.

FIG. 2B is a schematic illustration of a DBI configuration from a burst length view. FIG. 2B shows eight sets of data (i.e., 0-7) to transmit over the bus from the controller to the memory device. The eight sets of data are eight bytes of data that each comprise eight bits. Each bit of a byte is to transmit along a data channel (i.e., DQ0-DQ7). The DBI bit is transmitted along a separate channel (i.e., DBI #). For each byte, the table shows the data from the core (i.e., left part of each column) and the bus data (i.e., the right part of each column). For the first bit of the first byte (i.e., DQ0 for byte 0), the data from the core is "L" or low (i.e. 1) while the data bus is "H" or high (i.e. 0). The second, third, sixth, seventh, and eighth bits (i.e. DQ1, DQ2, DQ5, DQ6, DQ7) of the first byte (i.e. byte 0) are the same (i.e., data from core is "L" while bus data is "H") as the first bit (i.e. DQ0) of the first byte (i.e., byte 0). However, the fourth and fifth bits (i.e., DQ3 and DQ4) of the first byte (i.e., byte 0) both have data from the core as "H" or high (i.e., 0) while the bus data is "L" or low (i.e., 1). Hence, for the first byte, at least one bit has a different value for data from the core as compared to the bus data. Thus, the bus data will need to change (i.e., flip) to match the data from the core. Because the bus data will need to change to match the data from the core, the DBI bit (i.e., DBI #) is set to "L" or low (i.e., 1) to signal that the bus data will need to change.

Contrasting byte 0 with byte 1, it can be seen that for each bit of byte 1, the value of the data from the core matches the bus data. Hence, the bus data does not need to change to match the data from the core. Thus, the DBI bit (i.e., DBI #) can be set to "H" or high (i.e., 0) to signal that the bus data does not need to change for the transmitted data.

As will be discussed herein, cooperation between the DBI functionality and an error correction code (ECC) engine, such that the ECC engine will be acknowledged in the activated DBI events which are more prone to bit flip errors. In a way, the correction capabilities at the DBI activation weak points is compensated by designated ECC treatment.

In one embodiment, a quasi-static DBI functionality is employed. The DBI bit will not be allowed to toggle at each clock (i.e., DQS), but rather, will have to stay static for a predetermined number (i.e., X) of clocks (e.g., 2 or 3 clocks). Given a bit flip rate of F, an immediate impact of the restriction on the operation of the DBI bit is that the probability for unrecognized flip events of a channel line, which is usually one byte, is reduced by a factor of $(X-1)^F$. For example, given a flip bit rate of the DBI bit of 0.1 (i.e., 10% of the time, the DBI bit is flipped), and a value of 2 for X, the probability of unrecognized miss-readings of the whole channel bit due to DBI flip is reduced from 10% to 1%.

Figure 3:
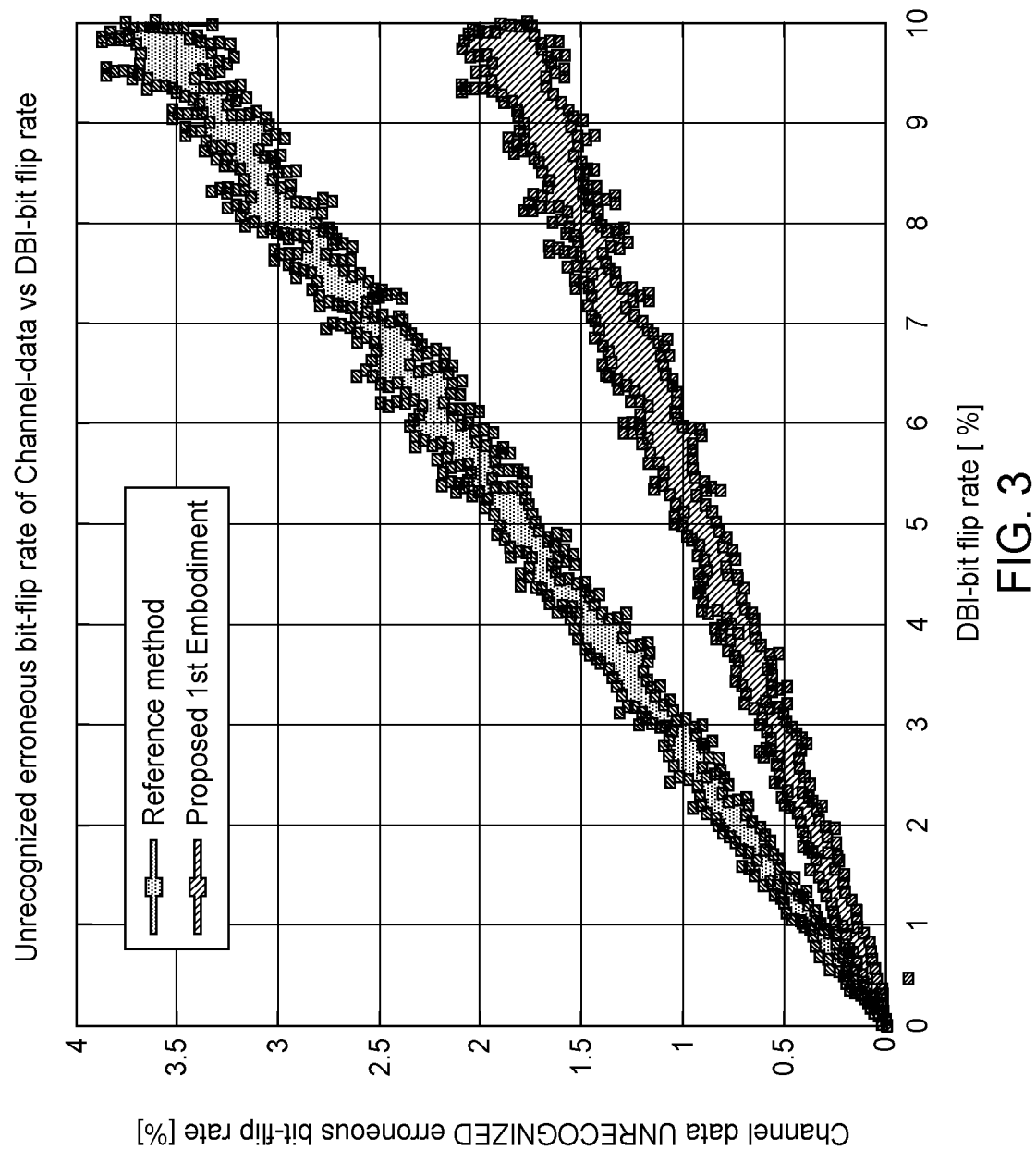
FIG. 3 is a graph illustrating unrecognized erroneous bit-flip rates of channel-data vs. DBI-bit flip rate according to one embodiment.

FIG. 3 is a graph illustrating unrecognized erroneous bit-flip rates of channel-data vs. DBI-bit flip rate according to one embodiment. FIG. 3 presents a simulation of X=2 with different DBI bit flip rates (x-axis). The top curve indicates the reference method, whereas the bottom curve represents the proposed method. The y-axis presents the unrecognized/undetected erroneous bit flip rate of the channel bits simulated over 20 kilo-bytes at each point of the x-axis. It can be observed from FIG. 3 that the proposed method of constraining the DBI bit for X consecutive clocks reduces the erroneous bit flip of the channel bits versus the reference method (i.e., no DBI bit constraints).

It should be noted that as the proposed method (i.e., DBI bit constraints) applies a more conservative DBI functionality, which includes performance impacts, due to limiting the DBI functionality operation. Typical numbers produced in simulations indicate that the average toggle rate of the channel bits at the reference method (i.e., no DBI bit constraints) is between about 35%-27.5% whereas in the proposed method (i.e., constraining DBI bit flips for X consecutive clocks) results in an average toggle rate of the channel bits raised up to about 40-41%.

As illustrated in FIG. 3, the embodiment of constraining the DBI bit flip reduces the rate of unrecognized erroneous flipped channel data due to DBI bit flip. It should be noted that in case of that part of the DBI bits of each tuple of consecutive X channel bytes transfer, the ECC engine will be notified. In the case of notifying the ECC engine, the ECC engine can take relevant countermeasures by treating the data bits are unreliable or even consider reading either the channel bytes are read or the NOT( ) version of the read channel bytes. Specifically, for a low density parity check (LDPC) ECC engine, the ECC can allocate a lower log likelihood ratio (LLR) value for the suspected channel bytes (e.g., LLR value of 0) and by that improve the correction capability and decoding duration.

In another embodiment, the regular dynamic DBI functionality is maintained (i.e., set the relevant DBI bit for each channel byte independently). The issue of enhanced error rate due to DBI bit flips can still be mitigated in another manner. While in the previous embodiment, the ECC engine was informed for cases of non-identical DBI bits at each X-tuple (e.g., 2/3 consequent channel bytes transferred), in the instant embodiment, there are no tuples of consecutive channel bytes. The ECC engine will be informed about each and any active DBI bit events. The ECC engine will allocate reduced reliability (e.g., LLR values in LDPC decoding operations) for all of the bits near the active DBI bit point. By that, the decoding procedure will avoid the expected related hard errors and approach the overall reduced decoding duration with higher correction capability.

It should be noted that due to synchronization issues, the exact allocation of the active DBI bit events might not be 100% accurate and therefore, the allocated reduced LLR values will refer to the close surrounding of the DBI indication. It should also be noted that the embodiments can be combined such that both static DBI bits and informing the ECC engine about each and any active DBI bit events both occur.

Figure 4:
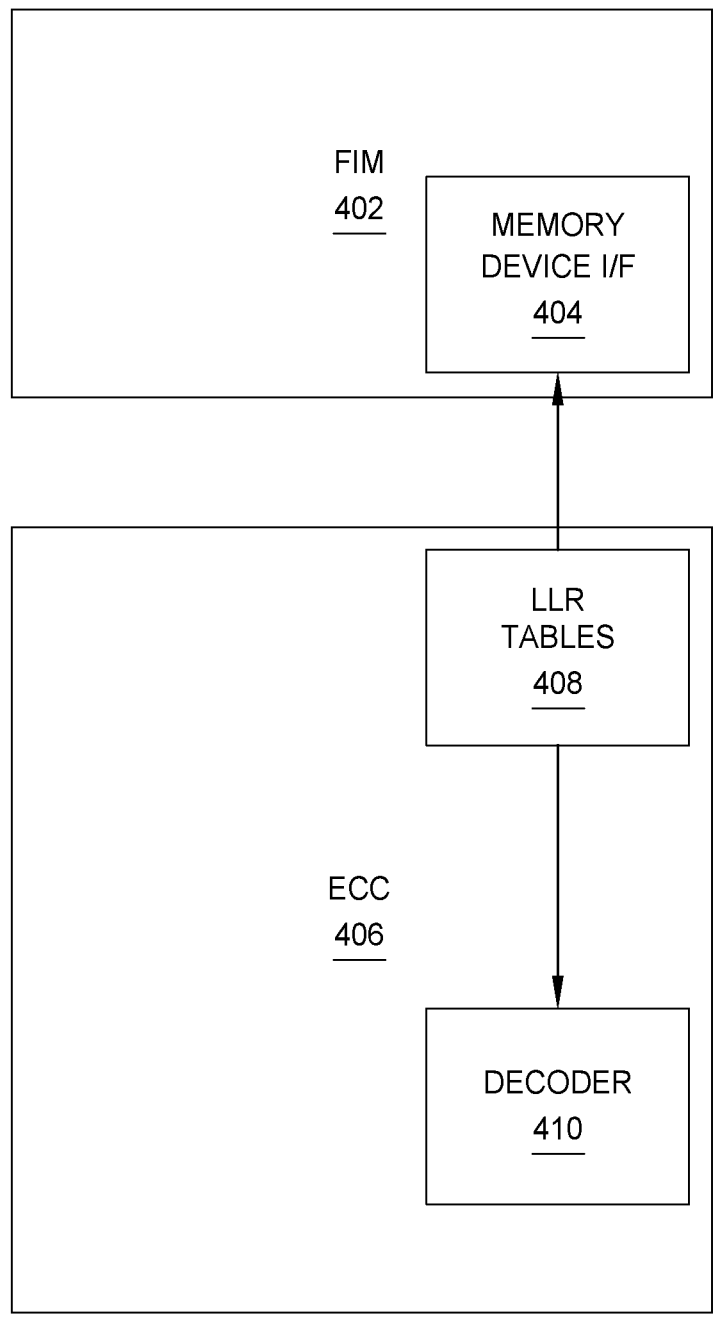
FIG. 4 is a schematic illustration of processing raw data according to one embodiment.

FIG. 4 is a schematic illustration of processing raw data according to one embodiment. As shown in FIG. 4, the flash interface module (FIM) 402 comprises a memory device interface (I/F) 404. The FIM 402 is coupled to the ECC engine 406. The ECC engine 406 comprises the LLR tables 408 and the decoder 410. The raw data is provided to the ECC engine 406 from FIM 402 via the memory device I/F 404. The LLR tables 408 are consulted to inform the decoder 410 regarding the reliability of the data so that the decoder can make appropriate decoding decisions.

Figure 5:
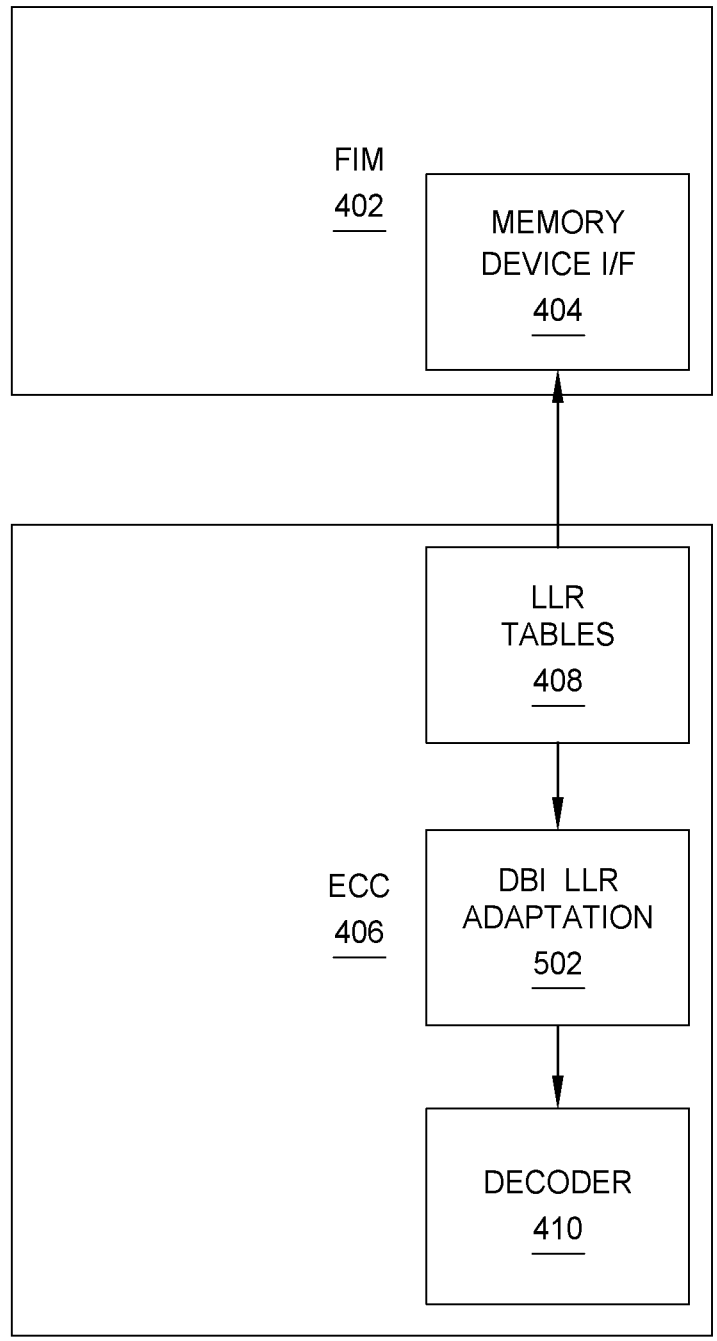
FIG. 5 is a schematic illustration of processing raw data utilizing DBI functionality according to one embodiment.

FIG. 5 is a schematic illustration of processing raw data utilizing DBI functionality according to one embodiment. FIG. 5 is a schematic qualitative showing of the concept of delivering the DBI bits on top of the raw data to the LDPC engine, which as noted above is relevant for all embodiments. As shown in FIG. 5, the ECC engine 406 also comprises a DBI LLR adaption module 502, which may include one or more tables, that couples with the memory device I/F 404. Because the DBI bit leads to less reliability in LLR, not only is the LLR table consulted, but the ECC engine 406 is specifically informed regarding the active DBI bits. The ECC engine 406 is informed by consulting the DBI LLR adaptation module 502 that receives a notification from the memory device I/F 404. The information from both the LLR tables 408 and the DBI LLR adaptation module 502 is fed to the decoder 410 so that appropriate decoding decisions can be made.

It is also contemplated that the DBI functionality can be, in essence, turned off in another embodiment based upon current power consumption relative to overall power budget. Stated another way, the DBI bit can be fixed at 0 so long as the current power consumption is at or above a predetermined threshold of the overall power budget. The level of usage of the DBI bit is a function of the current power consumption relative to the overall power budget. The level of usage embodiment is contemplated to be combined with either or both of the static DBI bit embodiment and the informing the ECC engine about each and any active DBI bit events both occur embodiment. For example, the current power consumption can change the threshold value X from the static DBI bit embodiment. Additionally, it is contemplated that the embodiments discussed herein may work in parallel. For example, limiting the functionality of the DBI feature and informing the ECC engine of each and every DBI value can work in parallel.

In another embodiment, the threshold is based upon data integrity of the DBI bit. The DBI feature is permitted so that power consumption will be reduced (when compared to not utilizing the DBI feature but also taking into account data integrity (which is more important). Therefore, limiting the functionality of the DBI feature using the threshold is done to make sure there are not extra errors on the interface.

Figure 6:
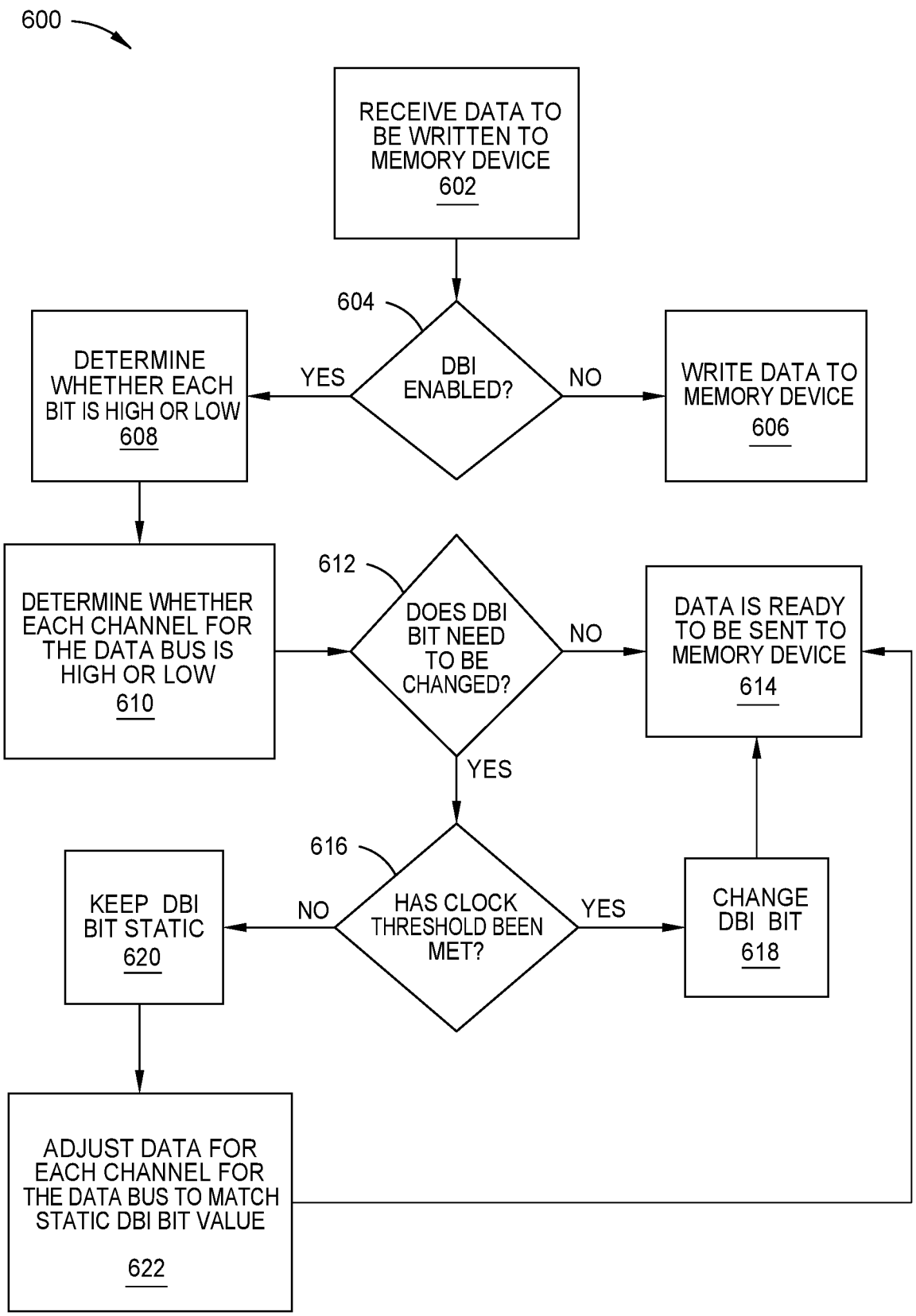
FIG. 6 is a flowchart illustrating a process of utilizing DBI functionality according to one embodiment.

FIG. 6 is a flowchart 600 illustrating a process of utilizing DBI functionality according to one embodiment. Initially, the controller of a data storage device receives data to be written to a memory device at 602. A determination is made regarding whether the DBI functionality is not only present, but enabled at 604. The DBI functionality may be present, but not enabled due to power consumption relative to overall power budget levels. The flowchart 600 illustrates a scenario where DBI functionality is present, but the determination is in regards to whether the functionality is enabled. If the DBI functionality is not enabled, the data is simply written to the memory device in the normal manner at 606.

If DBI functionality is enabled at 604, then the controller determines, for each byte to be written, whether each individual bit is low or high at 608. The controller also determines whether the data bus between the controller and the memory device is low or high for each channel upon which the individual bits will be delivered at 610. Items 608 and 610 may occur in any order or simultaneously.

Given the determinations as 608 and 610, another determination is made at 612. Specifically, whether the DBI bit needs to be changed. If the DBI bit does not need to be changed, then the data is ready to be sent to the memory device at 614. If the DBI bit needs to be changed, a determination is made regarding whether a clock threshold has been met at 616. If the threshold has been met, then the DBI bit is changed at 618, and the data is then ready to be sent to the memory device at 614. If the threshold has not been met at 616, then the DBI bit is kept static at whatever the last DBI bit value was at 620, the data is adjusted (i.e., flipped if necessary) at 622 for each channel so that the data matches the necessary DBI bit value that must remain static. The data is then ready to be sent to the memory device at 614. For example, if the DBI bit is currently set to "0", and the DBI bit is to remain static for a predetermined clock cycle, the DBI bit will remain "0" for the predetermined number of clock cycles. Similarly, if the DBI bit is currently set to "1", and the DBI bit is to remain static for a predetermined clock cycle, the DBI bit will remain "1" for the predetermined number of clock cycles.

It is contemplated that rather than changing the data, the DBI bit can be set to 0 so that each bit of a byte is determined on the data bus based upon the actual channel rather than based upon the DBI bit. It is also contemplated that holding the DBI value static may occur only when the DBI bit is already at a value of 0.

Figure 7:
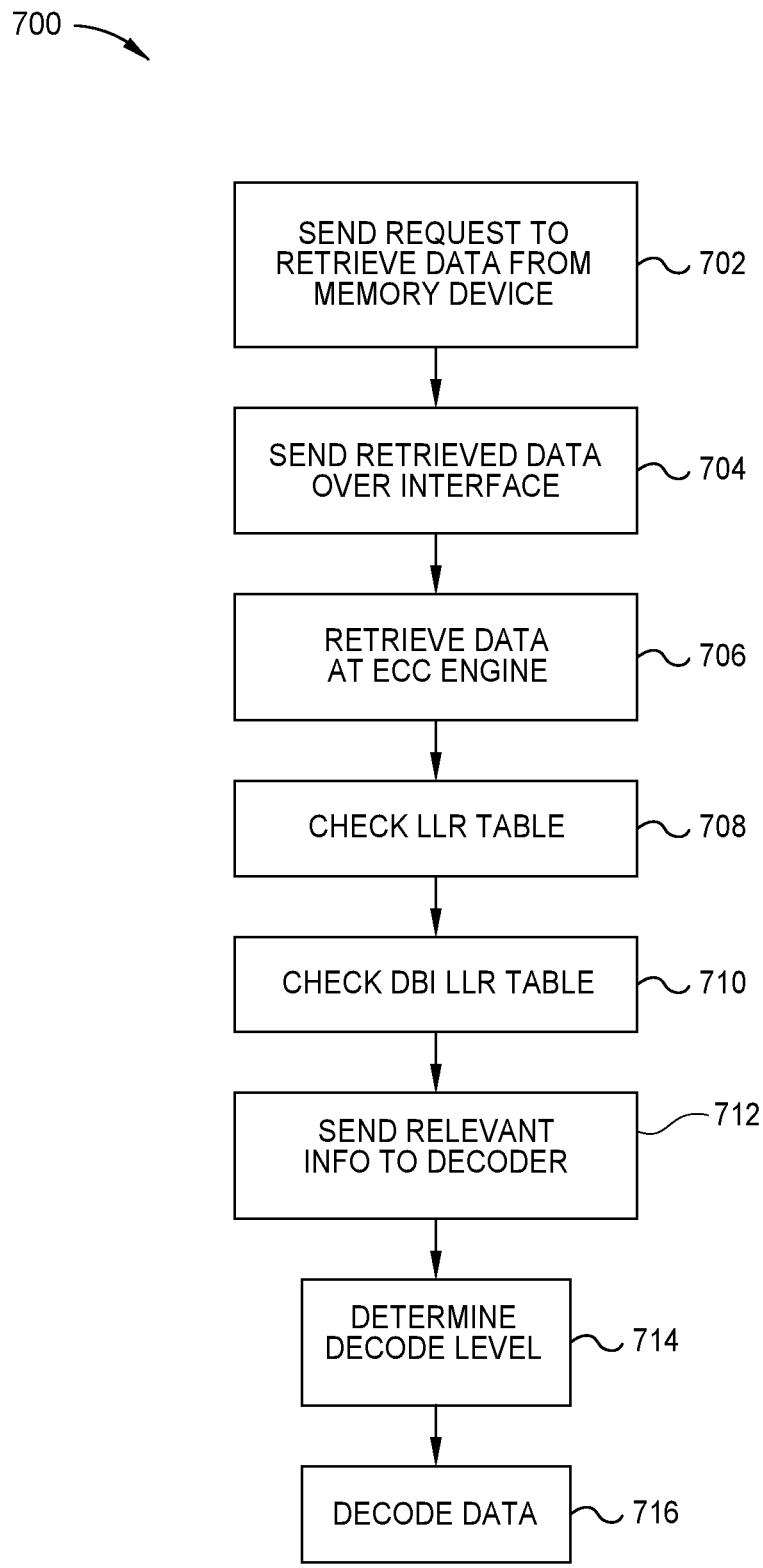
FIG. 7 is a flowchart illustrating a process of utilizing DBI functionality according to another embodiment.

FIG. 7 is a flowchart 700 illustrating a process of utilizing DBI functionality according to another embodiment. After receiving a read command, the controller sends a request to retrieve data from the memory device at 702. The data is retrieved and sent over the interface between the memory device and the controller at 704. The data is received at an ECC engine at 706. The controller checks LLR tables at 708 to see find the LLR reliability for the retrieved data. A DBI LLR table if also checked at 710 to provide additional reliability information given the DBI bit. The DBI information is sent to a DBI LLR adaptation module to check the DBI LLR table. Thereafter, at 712, relevant info from both the LLR table and the DBI LLR table is sent to the decoder which then determines the decode level to perform at 714. For example, due to the low reliability based upon either the LLR table or DBI LLR table, more intensive decoding operations may be performed that would otherwise occur. The data is then decoded at 716.

By forcing a DBI bit to remain stay static for a predetermined number of consecutive clock cycles, by informing an error correction module of reduced reliability due to active DBI bit events, by fixing a DBI bit to 0, or combinations thereof, effects of enhanced erroneous bit flip rate related to DBI bit flip events are mitigated, thus improving data transfer in a data storage device. Furthermore, reducing the rate of erroneous channel bit flips due to DBI flip events is a result of the embodiments discussed herein, which thus improves the correction capability and decoding duration. Additionally, usage of DBI can be adapted to memory device (e.g., NAND) attributes while also leveraging the power savings.

In one embodiment, a data storage device comprises: a memory device; and a controller coupled to the memory device, wherein the controller is configured to: receive data from a host device; arrange the data into one or more bursts, wherein each burst comprises a plurality of bytes; set a data bus inversion (DBI) bit for each byte, wherein a plurality of consecutive DBI bits within at least one burst of the one or more bursts are identical; and send the one or more bursts and DBI bits to the memory device. The DBI bits are sent in a separate channel from the data in the one or more bursts. The plurality of consecutive bits that are identical corresponds to a predetermined number of clock cycles, and wherein during each clock cycle, one byte and one DBI bit is sent to the memory device. The DBI bit is a bit that is distinct from bits of the plurality of bytes. The controller is configured to manipulate the data prior to sending the one or more bursts, wherein the manipulating comprises flipping bits in one or more bytes of the plurality of bytes. Flipping bits comprises flipping bits such that a DBI bit for a byte corresponding to the flipped bits can be set to 1. Flipping bits comprises flipping bits such that a DBI bit for a byte corresponding to the flipped bits can be set to 0. Setting the DBI bit for each byte comprises setting the DBI bit to 0. The plurality of consecutive DBI bits is based upon a threshold, wherein the threshold when transitioning from 1 to 0 is different than the threshold when transitioning from 0 to 1. It is to be understood that the threshold is also contemplated to be identical regardless of whether transitioning from 1 to 0 or from 0 to 1. The threshold is dynamic.

In another embodiment, a data storage device comprises: a memory device; and a controller coupled to the memory device, wherein the controller is configured to: retrieve data from the memory device; send retrieved data to a decoder; search a log likelihood ratio (LLR) table for reliability indication of the retrieved data; send data bus inversion (DBI) bit information to the decoder for the retrieved data; and decode the retrieved data. The controller is further configured to provide an indication to the decoder that a byte to be read has an active DBI bit event. An active DBI event comprises determining that a DBI bit value is a different value from an adjacent DBI bit value. The decoder is a part of an error correction module, wherein the error correction module additionally comprises the LLR table and a DBI LLR adaptation module. The indication is provided to the DBI LLR adaptation module. Decoding the data comprises changing a decoding level based upon searching the LLR table and the DBI bit information.

In another embodiment, a data storage device comprises: memory means; and a controller coupled to the memory means, wherein the controller is configured to: maintain a data bus inversion (DBI) bit at a constant value for a plurality of consecutive bytes of a data burst; and decode data retrieved from the memory means, wherein a level of decoding is based in part upon the DBI bit. The level of decoding is additionally based upon log likelihood ratio (LLR) data for the data retrieved. The constant value is maintained for a plurality of consecutive bytes based upon data integrity of the DBI bit.

While the foregoing is directed to embodiments of the present disclosure, other and further embodiments of the disclosure may be devised without departing from the basic scope thereof, and the scope thereof is determined by the claims that follow.

What is claimed is:
1. A data storage device, comprising:
a memory device; and
a controller coupled to the memory device, wherein the controller is configured to:
receive data from a host device;
arrange the data into one or more bursts, wherein each burst comprises a plurality of bytes;
set a data bus inversion (DBI) bit for each byte, wherein a plurality of consecutive DBI bits within at least one burst of the one or more bursts are identical, and wherein the plurality of consecutive DBI bits that are identical corresponds to a predetermined number of clock cycles;

send the one or more bursts and DBI bits to the memory device;

send a first reliability indication to the memory device, wherein the first reliability indication is based on a search of a log likelihood ratio (LLR) table of the received data;

send a second reliability indication to the memory device, wherein the second reliability indication is based on a search of a DBI LLR table of the DBI bit; and determine a decoding level based upon the first and second reliability indicator.

2. The data storage device of claim 1, wherein the DBI bits are sent in a separate channel from the data in the one or more bursts.

3. The data storage device of claim 1, wherein during each clock cycle, one byte and one DBI bit is sent to the memory device.

4. The data storage device of claim 1, wherein the DBI bit is a bit that is distinct from bits of the plurality of bytes.

5. The data storage device of claim 1, wherein the controller is configured to manipulate the data prior to sending the one or more bursts, wherein the manipulating comprises flipping bits in one or more bytes of the plurality of bytes.

6. The data storage device of claim 5, wherein flipping bits comprises flipping bits such that a DBI bit for a byte corresponding to the flipped bits can be set to 1.

7. The data storage device of claim 5, wherein flipping bits comprises flipping bits such that a DBI bit for a byte corresponding to the flipped bits can be set to 0.

8. The data storage device of claim 1, wherein setting the DBI bit for each byte comprises setting the DBI bit to 0.

9. The data storage device of claim 1, wherein the plurality of consecutive DBI bits is based upon a threshold.

10. The data storage device of claim 9, wherein the threshold when transitioning from 1 to 0 is different than the threshold when transitioning from 0 to 1.

11. The data storage device of claim 9, wherein the threshold is dynamic.

12. A data storage device, comprising:

a memory device; and a controller coupled to the memory device, wherein the controller is configured to:

retrieve data from the memory device;

send retrieved data to a decoder;

search a log likelihood ratio (LLR) table for a first reliability indication of the retrieved data;

send a data bus inversion (DBI) bit associated with the retrieved data to a DBI LLR adaptation module, wherein the DBI LLR adaptation module comprises a DBI LLR table;

search the DBI LLR table for a second reliability indication of the DBI bit;

send the first reliability indication and the second reliability indication to the decoder for the retrieved data;

decode the retrieved data;

determine a decode level to perform based on the first and second reliability indication; and force a DBI bit to remain constant for a predetermined number of consecutive clock cycles.

13. The data storage device of claim 12, wherein the controller is further configured to provide an indication to the decoder that a byte to be read has an active DBI bit event.

14. The data storage device of claim 13, wherein an active DBI event comprises determining that a DBI bit value is a different value from an adjacent DBI bit value.

15. The data storage device of claim 13, wherein the decoder is a part of an error correction module, wherein the error correction module additionally comprises the LLR table and the DBI LLR adaptation module.

* * * * *